(12) United States Patent
Tsukamoto et al.

(10) Patent No.: US 9,627,284 B2
(45) Date of Patent: Apr. 18, 2017

(54) SEMICONDUCTOR DEVICE

(71) Applicant: Mitsubishi Electric Corporation, Tokyo (JP)

(72) Inventors: Hideki Tsukamoto, Tokyo (JP); Mituharu Tabata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/926,805

(22) Filed: Oct. 29, 2015

(65) Prior Publication Data

US 2016/0284618 A1  Sep. 29, 2016

(30) Foreign Application Priority Data

Mar. 25, 2015  (JP) .................................. 2015-062241

(51) Int. Cl.
*H01L 23/48* (2006.01)
*H01L 23/055* (2006.01)
*H01L 23/552* (2006.01)

(52) U.S. Cl.
CPC .......... *H01L 23/055* (2013.01); *H01L 23/552* (2013.01)

(58) Field of Classification Search
CPC .............................. H01L 23/055; H01L 23/28
USPC ........................................ 257/696, 692, 787
See application file for complete search history.

(56) References Cited

U.S. PATENT DOCUMENTS

| 5,523,620 A * | 6/1996 | Eytcheson | H01L 24/49 257/341 |
|---|---|---|---|
| 7,589,400 B2 * | 9/2009 | Hozoji | H01L 24/36 257/673 |
| 8,363,420 B2 * | 1/2013 | Tominaga | H05K 3/32 361/715 |
| 8,395,248 B2 * | 3/2013 | Nozaki | H01L 23/49524 257/676 |
| 8,546,926 B2 * | 10/2013 | Kawanami | H01L 25/072 257/678 |
| 9,171,768 B2 * | 10/2015 | Takamiya | H01L 23/055 |
| 2002/0195286 A1 * | 12/2002 | Shirakawa | B60L 11/1803 180/65.1 |
| 2012/0181682 A1 * | 7/2012 | Soyano | H01L 23/04 257/692 |
| 2012/0256194 A1 | 10/2012 | Yoshihara et al. | |

(Continued)

FOREIGN PATENT DOCUMENTS

| JP | H06-342872 A | 12/1994 |
| JP | 2013-021107 A | 1/2013 |
| WO | 2010/131679 A1 | 11/2010 |

*Primary Examiner* — Nitin Parekh
(74) *Attorney, Agent, or Firm* — Studebaker & Brackett PC

(57) ABSTRACT

A semiconductor device includes: a resin case that houses a semiconductor element; a parallel plate that is disposed inside the resin case while being connected with the semiconductor element, the parallel plate including two flat plates parallel to each other with an insulating material therebetween; and two electrodes that are each led out from an upper end of the parallel plate and are disposed on an upper surface of the resin case at a predetermined interval. Upper end portions of the two flat plates of the parallel plate between two electrode lead-out portions are bent toward the outside being a direction in which the upper end portions of the two flat plates become more distant from each other, the two electrodes being led out from the corresponding two electrode lead-out portions.

9 Claims, 6 Drawing Sheets

(56) References Cited

U.S. PATENT DOCUMENTS

| | | |
|---|---|---|
| 2013/0015496 A1 | 1/2013 | Konno et al. |
| 2014/0210067 A1* | 7/2014 | Takamiya ............. H01L 23/055 |
| | | 257/698 |
| 2015/0115423 A1* | 4/2015 | Yamashita ........ H01L 23/49575 |
| | | 257/675 |

* cited by examiner

F I G. 12
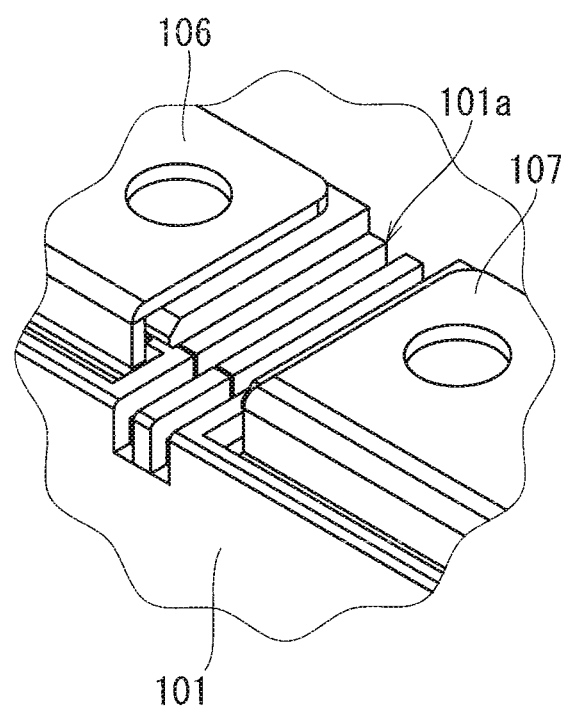

SEMICONDUCTOR DEVICE

BACKGROUND OF THE INVENTION

Field of the Invention

The present invention relates to a reduction in a self-inductance of a semiconductor device.

Description of the Background Art

Power modules such as IGBT modules and SiC modules have configurations in which a plurality of terminals (electrodes) are disposed such that total currents cancel each other out to be approximately zero. In such configuration, to reduce a self-inductance of a semiconductor device, the plurality of terminals are disposed close to each other with an insulating material therebetween and the close portions of the plurality of terminals are disposed in parallel (see Japanese Patent Application Laid-Open No. 2013-21107, for example), However, the terminals for connection with external circuits need to be open to the outside from an insulating resin case, and the plurality of terminals need to be disposed at an interval to secure a creepage distance. Alternatively, irregularities are provided on an upper surface of the resin case to secure the creepage distance, thereby hardly reducing more than a fixed self-inductance of the semiconductor device.

SUMMARY OF THE INVENTION

It is an object of the present invention to provide a semiconductor device capable of reducing a self-inductance.

A semiconductor device includes a resin case that houses a semiconductor element, a parallel plate, and two electrodes. The parallel plate is disposed inside the resin case while being connected with the semiconductor element, the parallel plate including two flat plates parallel to each other with an insulating material therebetween. The two electrodes are each led out from an upper end of the parallel plate and are disposed on an upper surface of the resin case at a predetermined interval. Upper end portions of the two flat plates of the parallel plate between two electrode lead-out portions are bent toward the outside being a direction in which the upper end portions of the two flat plates become more distant from each other, the two electrodes being led out from the corresponding two electrode lead-out portions.

The upper end portions of the two flat plates of the parallel plate between the two electrode lead-out portions are bent toward the outside being the direction in which the upper end portions of the two flat plates become more distant from each other, the two electrodes being led out from the corresponding two electrode lead-out portions. This increases the thickness of the upper end portions of the two flat plates of the parallel plate between the two electrode lead-out portions. Magnetic flux easily concentrates in end portions in a horizontal direction of the parallel plate, but the thickness of the upper end portions of the two flat plates of the parallel plate between the two electrode lead-out portions is increased to relieve the concentration of the magnetic flux in the portions, which allows for the reduction in the self-inductance of the semiconductor device.

A semiconductor device includes a resin case that houses a semiconductor element, a parallel plate, and two electrodes. The parallel plate is disposed inside the resin case while being connected with the semiconductor element, the parallel plate including two flat plates parallel to each other with an insulating material therebetween. The two electrodes are each led out from an upper end of the parallel plate and are disposed on an upper surface of the resin case at a predetermined interval. A distance between upper portions of the two flat plates of the parallel plate between two electrode lead-out portions is greater than a distance between portions except for the upper portions between the two electrode lead-out portions, the two electrodes being led out from the corresponding two electrode lead-out portions.

The distance between the upper portions of the two flat plates of the parallel plate between the two electrode lead-out portions is greater than the distance between the portions except for the upper portions between the two electrode lead-out portions, so that effects similar to those of increasing the thickness of the upper portions of the two flat plates of the parallel plate between the two electrode lead-out portions can be obtained. Thus, the self-inductance of the semiconductor device can be reduced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 is an enlarged perspective view of a portion between electrode lead-out portions of the semiconductor device according to the underlying technology.

DESCRIPTION OF THE PREFERRED EMBODIMENTS

<First Preferred Embodiment>

Figure 1:
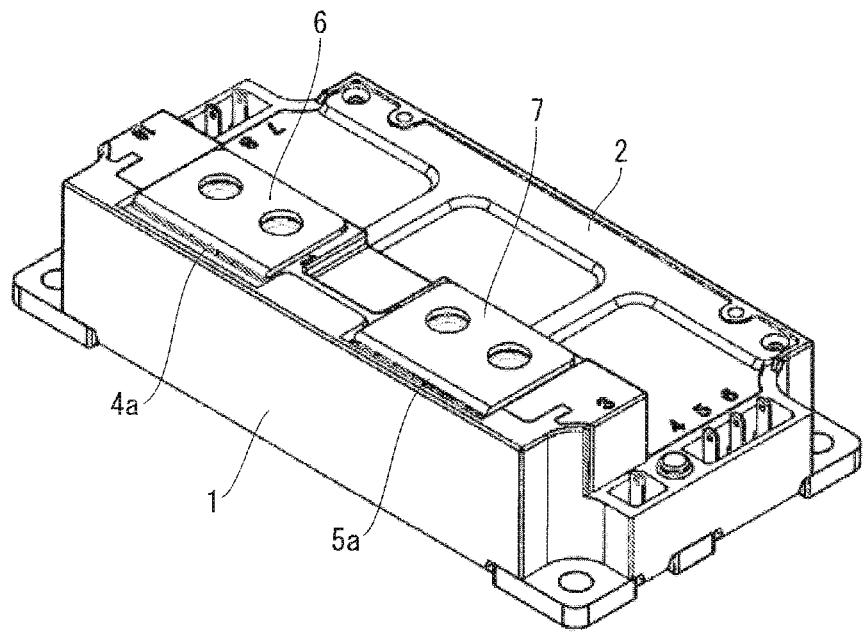
FIG. 1 is a perspective view of a semiconductor device according to a first preferred embodiment.
Figure 2:
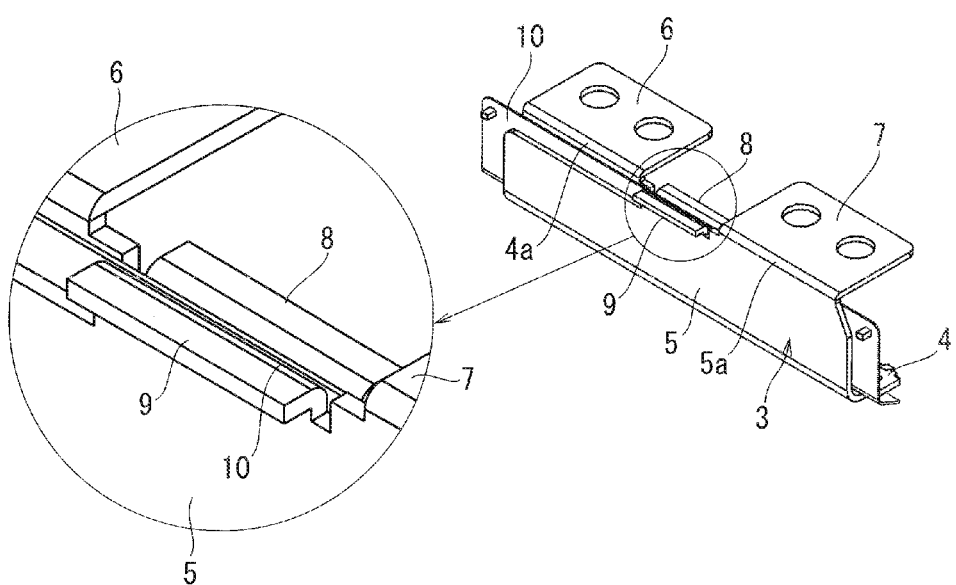
FIG. 2 is a perspective view of a parallel plate and electrodes of the semiconductor device according to the first preferred embodiment.

A first preferred embodiment of the present invention is described below with reference to the drawings. FIG. 1 is a perspective view of a semiconductor device according to the first preferred embodiment. FIG. 2 is a perspective view of a parallel plate 3, an electrode 6, and an electrode 7 of the semiconductor device according to the first preferred embodiment.

As shown in FIGS. 1 and 2, the semiconductor device is a power module such as an IGBT module or a SiC module and includes a resin case 1, the parallel plate 3, and the electrodes 6, 7. The resin case 1 formed in a box houses a semiconductor element (not shown) therein. The resin case 1 has an upper surface of a front portion positioned higher than an upper surface of a rear portion. A lid 2 is disposed on an upper end portion of the rear portion of the resin case 1, and the lid 2 forms the upper surface of the rear portion of the resin case 1.

The parallel plate 3 is disposed inside the front portion of the resin case 1 while being connected with the semiconductor element. The parallel plate 3 includes two flat plates 4, 5 parallel to each other with an insulating material 10 therebetween. The flat plate 4 is formed to extend in a width direction of the resin case 1 and is disposed such that a main surface faces the front or the rear. The electrode 6 is led out from an upper end (electrode lead-out portion 4a) of a left end portion in the width direction of the flat plate 4 toward the rear. The flat plate 5 is formed to extend in the width direction of the resin case 1 and is disposed such that a main surface faces the front or the rear. The electrode 7 is led out from an upper end (electrode lead-out portion 5a) of a right end portion in the width direction of the flat plate 5 toward the rear. The electrode 6 and the electrode 7 are disposed on the upper surface of the front portion of the resin case 1 at a predetermined interval.

Upper end portions of the two flat plates 4, 5 of the parallel plate 3 between the two electrode lead-out portions 4a, 5a include corresponding bent portions 8, 9 bent toward the outside being a direction in which the bent portions 8, 9 become more distant from each other. The bent portions 8, 9 increase a thickness of the upper end portions of the two flat plates 4, 5 of the parallel plate 3 between the two electrode lead-out portions 4a, 5a to relieve a concentration of magnetic flux in the portions, which allows for a reduction in a self-inductance of the semiconductor device.

Figure 3:
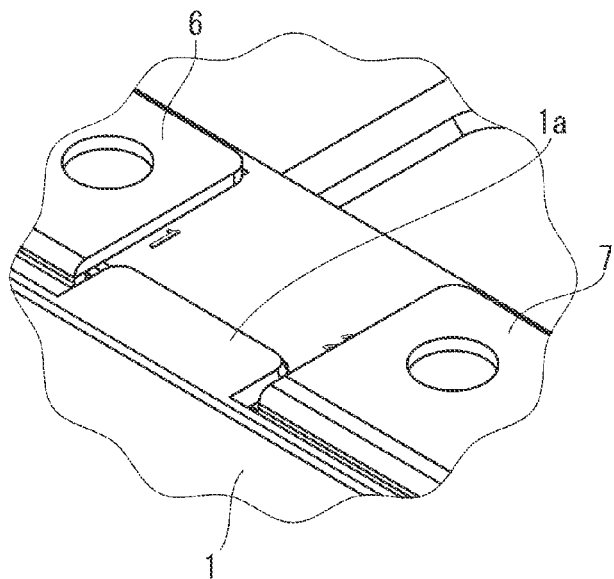
FIG. 3 is an enlarged perspective view showing a portion between electrode lead-out portions of the semiconductor device according to the first preferred embodiment.
Figure 4:
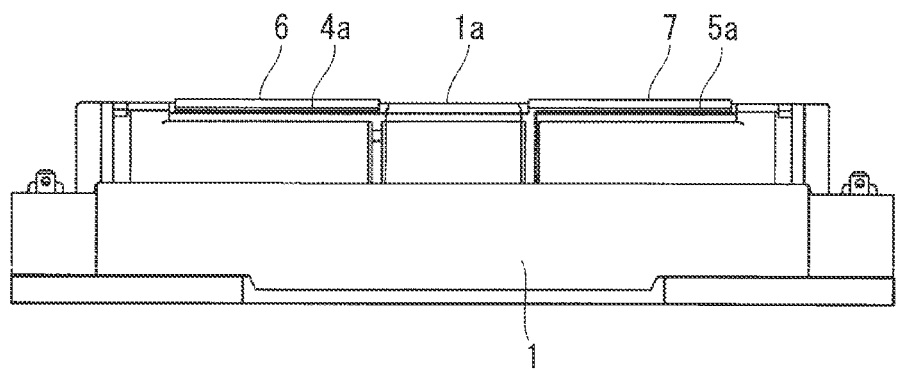
FIG. 4 is a front view of the semiconductor device according to the first preferred embodiment.
Figure 5:
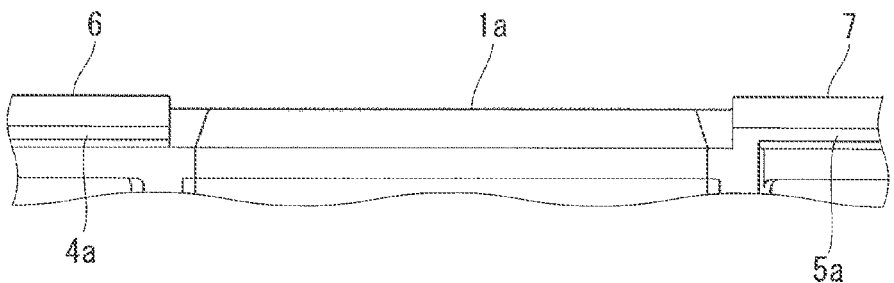
FIG. 5 is an enlarged front view showing an upper end portion of the semiconductor device according to the first preferred embodiment.

Next, a structure of the upper surface of the front portion of the resin case 1 is described. FIG. 3 is an enlarged perspective view showing the portion between the electrode lead-out portions 4a, 5a of the semiconductor device according to the first preferred embodiment. FIG. 4 is a front view of the semiconductor device according to the first preferred embodiment. FIG. 5 is an enlarged front view showing the upper end portion of the semiconductor device according to the first preferred embodiment.

As shown in FIG. 3, a region 1a corresponding to a portion between the electrode lead-out portions 4a, 5a on the upper surface of the resin case 1 is formed in a planar shape. More specifically, the resin case 1 has an upper surface of an anterior portion of the front portion positioned higher than an upper surface of a posterior portion of the front portion, and the region 1a is a region corresponding to the portion between the electrode lead-out portions 4a, 5a on the upper surface of the anterior portion of the front portion of the resin case 1. In addition, the region corresponding to the portion between the electrode lead-out portions 4a, 5a on the upper surface of the posterior portion of the front portion of the resin case 1 is also formed in the planar shape. Here, the parallel plate 3 is housed inside the anterior portion of the front portion of the resin case 1. The electrode lead-out portions 4a, 5a are connected with external parallel-plate wiring (bus bar), but the region 1a is formed in the planar shape, so that the portion of the parallel plate 3 between the electrode lead-out portions 4a, 5a can be brought close to the bus bar.

It is simply conceivable that the self-inductance of the semiconductor device can be more reduced by bringing the electrode lead-out portions 4a, 5a close to each other. As a result of the repeated detailed simulations of an electromagnetic field, however, the inventor of the specification obtains findings. that the self-inductance of the semiconductor device can be more reduced in the case where the portion of the parallel plate 3 between the electrode lead-out portions 4a, 5a can be brought close to the bus bar than in the case where the electrode lead-out portions 4a, 5a are brought close to each other. For this reason, the region 1a corresponding to the portion between the electrode lead-out portions 4a, 5a on the upper surface of the resin case 1 may not have the uneven shape to secure the creepage distance.

As shown in FIGS. 4 and 5, the region 1a corresponding to the portion between the electrode lead-out portions 4a, 5a on the upper surface of the anterior portion of the front portion of the resin case 1 is located in a height position between upper surfaces of the electrodes 6, 7 and lower surfaces of the electrodes 6, 7. The parallel plate 3 can be disposed in the upper portion inside the anterior portion of the front portion of the resin case 1, which can bring the portion of the parallel plate 3 between the electrode lead-out portions 4a, 5a close to the bus bar. Here, the region 1a corresponding to the portion between the electrode lead-out portions 4a, 5a on the upper surface of the resin case 1, namely, the height position of the portion of the resin case 1 covering the portion of the parallel plate 3 between the electrode lead-out portions 4a, 5a is preferably high within tolerance limits of mounting of the bus bar.

Figure 10:
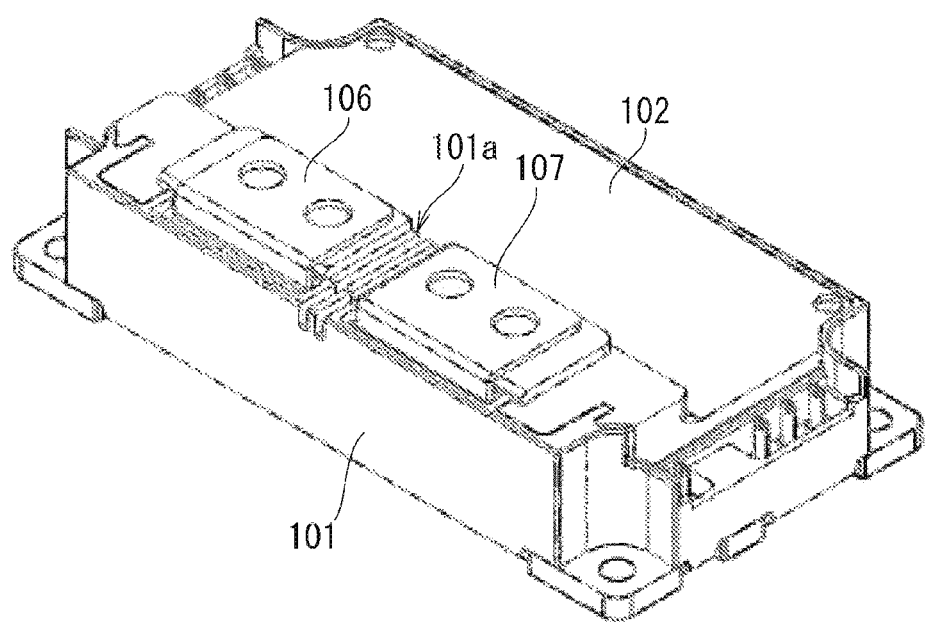
FIG. 10 is a perspective view of a semiconductor device according to an underlying technology.
Figure 11:
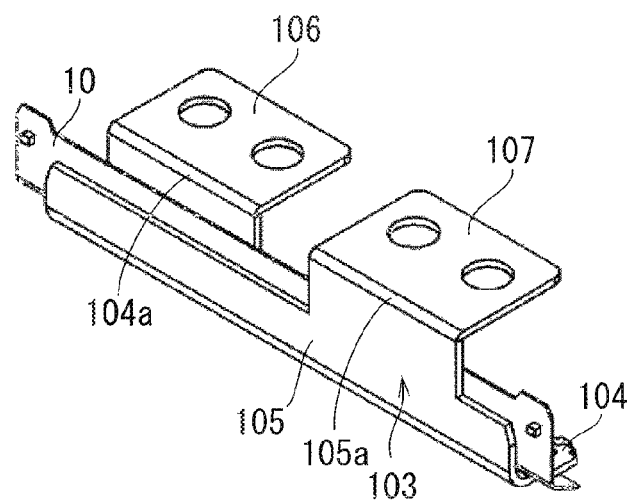
FIG. 11 is a perspective view of a parallel plate and electrodes of the semiconductor device according to the underlying technology.

Next, effects obtained from the semiconductor device according to the first preferred embodiment are described in comparison with a semiconductor device according to an underlying technology. FIG. 10 is a perspective view of the semiconductor device according to the underlying technology. FIG. 11 is a perspective view of a parallel plate 103, an electrode 106, and an electrode 107 of the semiconductor device according to the underlying technology. FIG. 12 is an enlarged perspective view of a portion between an electrode lead-out portion 104a and an electrode lead-out portion 105a of the semiconductor device according to the underlying technology.

First, the semiconductor device according to the underlying technology is described. As shown in FIGS. 10 and 11, the semiconductor device according to the underlying technology includes a resin case 101, the parallel plate 103, and the electrodes 106, 107. A lid 102 is disposed on an upper end portion of a rear portion of the resin case 101, and the lid 102 forms an upper surface of the rear portion of the resin case 101.

The parallel plate 103 is disposed inside a front portion of the resin case 101 while being connected with a semiconductor element. The parallel plate 103 includes two flat plates 104, 105 parallel to each other with an insulating material 10 therebetween. The flat plate 104 is formed to extend in a width direction of the resin case 101 and is disposed such that a main surface faces the front or the rear. The electrode 106 is led out from an upper end (electrode lead-out portion 104a) of a left end portion in the width direction of the flat plate 104 toward the rear. The flat plate 105 is formed to extend in the width direction of the resin case 101 and is disposed such that a main surface faces the front or the rear. The electrode 107 is led out from an upper end (electrode lead-out portion 105a) of a right end portion in the width direction of the flat plate 105 toward the rear.

The electrode 106 and the electrode 107 are disposed on the upper surface of the front portion of the resin case 101 at a predetermined interval.

Here, in the underlying technology, the distance between the electrode 106 and the electrode 107 is shorter than that in the first preferred embodiment. The reason is that the shorter distance between the electrode lead-out portion 104*a* and the electrode lead-out portion 105*a* can reduce a self-inductance of the semiconductor device.

However, as shown in FIGS. 10 and 12, in the semiconductor device according to the underlying technology, a region 101*a* corresponding to a portion between the electrode lead-out portions 104*a*, 105*a* on the upper surface of the resin case 101 is formed in an uneven shape to secure a creepage distance between the electrode 106 and the electrode 107. For this reason, the portion of the parallel plate 103 between the electrode lead-out portions 104*a*, 105*a* and a bus bar connected with the electrode lead-out portions 104*a*, 105*a* have a long distance therebetween, thereby hardly reducing more than a fixed self-inductance of the semiconductor device.

In contrast, in the semiconductor device according to the first preferred embodiment, as shown in FIG. 2, the upper end portions of the two flat plates 4, 5 of the parallel plate 3 between the two electrode lead-out portions 4*a*, 5*a* are bent toward the outside being the direction in which the upper end portions of the two flat plates 4, 5 become more distant from each other, the two electrodes 6, 7 being led out from the corresponding two electrode lead-out portions 4*a*, 5*a*. This increases the thickness of the upper end portions of the two flat plates 4, 5 of the parallel plate 3 between the two electrode lead-out portions 4*a*, 5*a*. Magnetic flux easily concentrates in end portions in a horizontal direction of the parallel plate 3, but the thickness of the upper end portions of the two flat plates 4, 5 of the parallel plate 3 between the two electrode lead-out portions 4*a*, 5*a* is increased to relieve the concentration of the magnetic flux in the portions, which allows for the reduction in the self-inductance of the semiconductor device.

As shown in FIG. 3, the region 1*a* corresponding to the portion between the two electrode lead-out portions 4*a*, 5*a* on the upper surface of the resin case 1 is formed in the planar shape. This can shorten the distance from the portion of the parallel plate 3 between the electrode lead-out portions 4*a*, 5*a* to the bus bar, which allows for the reduction in the self-inductance of the semiconductor device.

As shown in FIGS. 4 and 5, the region 1*a* of the upper surface of the resin case 1 corresponding to the portion between the two electrode lead-out portions 4*a*, 5*a* is located in the height position between the upper surfaces of the two electrodes 6, 7 and the lower surfaces of the two electrodes 6, 7. This can shorten the distance from the portion of the parallel plate 3 between the electrode lead-out portions 4*a*, 5*a* to the bus bar, which allows for the reduction in the self-inductance of the semiconductor device.

<Second Preferred Embodiment>

Figure 6:
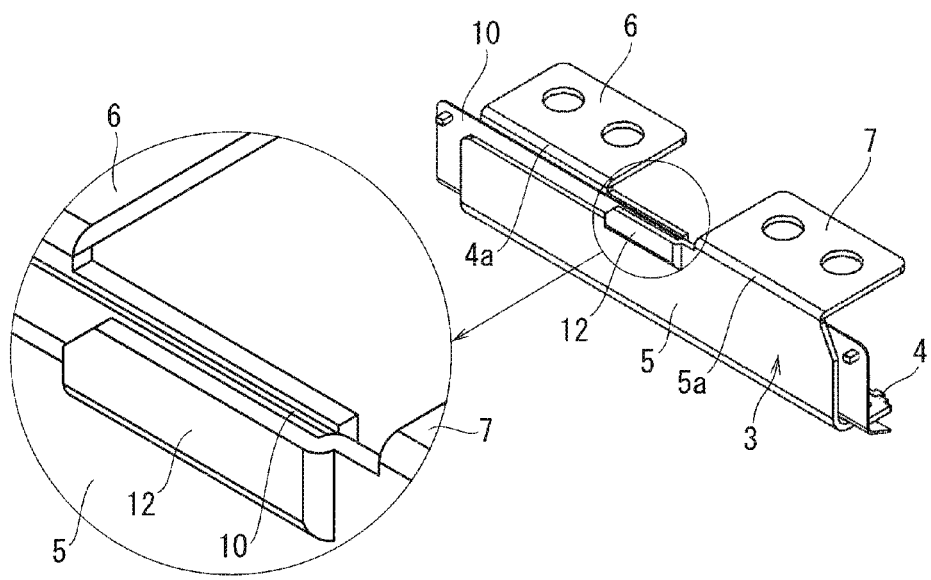
FIG. 6 is a perspective view of a parallel plate and electrodes of a semiconductor device according to a second preferred embodiment.

Next, a semiconductor device according to a second preferred embodiment is described. FIG. 6 is a perspective view of the parallel plate 3, the electrode 6, and the electrode 7 of the semiconductor device according to the second preferred embodiment. In the second preferred embodiment, the same components as those described in the first preferred embodiment are denoted by the same references, which are not described here.

As shown in FIG. 6, in the second preferred embodiment, a distance between upper portions of the two flat plates 4, 5 of the parallel plate 3 between the two electrode lead-out portions 4*a*, 5*a* is greater than a distance between portions except for the upper portions between the two electrode lead-out portions 4*a*, 5*a*. More specifically, the upper portion of the flat plate 5 of the parallel plate 3 between the two electrode lead-out portions 4*a*, 5*a* includes a projecting portion 12 that projects to the outside being a direction. Thus, the distance between the upper portions of the two flat plates 4, 5 of the parallel plate 3 between the two electrode lead-out portions 4*a*, 5*a* is greater than the distance between the portions except for the upper portions between the two electrode lead-out portions 4*a*, 5*a*. Consequently, effects similar to those of increasing the thickness of the upper portion of the flat plate 5 between the electrode lead-out portions 4*a*, 5*a* can be obtained. Here, the projecting portion 12 is formed by drawing. In addition, an upper portion of the flat plate 4 between the electrode lead-out portions 4*a*, 5*a* may include a projecting portion that projects to the outside being a direction in which the upper portion of the flat plate 4 becomes more distant from the flat plate 5 instead of that the flat plate 5 includes the projecting portion 12.

As described above, in the semiconductor device according to the second preferred embodiment, the distance between the upper portions of the two flat plates 4, 5 of the parallel plate 3 between the two electrode lead-out portions 4*a*, 5*a* is greater than the distance between the portions except for the upper portions between the two electrode lead-out portions 4*a*, 5*a*, so that the effects similar to those of increasing the thickness of the upper portion of the flat plate 5 between the electrode lead-out portions 4*a*, 5*a* can be obtained. Thus, a self-inductance of the semiconductor device can be reduced.

Here, as in the first preferred embodiment, bending the upper end portions of the two flat plates 4, 5 of the parallel plate 3 between the electrode lead-out portions 4*a*, 5*a* toward the outside being the direction in which the upper end portions of the two flat plates 4, 5 become more distant from each other needs a length to some extent in a bending direction. This results in the increase in the upper end portions of the two flat plates 4, 5 of the parallel plate 3 between the electrode lead-out portions 4*a*, 5*a*. Moreover, insert molding is typically used to dispose the parallel plate 3 inside the resin case 1, and insert pressure deforms the end portions of the electrodes 6, 7 that are thus easily brought close to each other. Then, the distance between the upper portions of the two flat plates 4, 5 of the parallel plate 3 between the electrode lead-out portions 4*a*, 5*a* is expanded while the upper portions are maintained in substantially parallel, so that the upper end portions of the two flat plates 4, 5 of the parallel plate 3 between the electrode lead-out portions 4*a*, 5*a* can be more compact than those in the first preferred embodiment, thereby obtaining excellent moldability.

The projecting portion 12 is formed by drawing, which can easily achieve the projecting portion 12.

<Third Preferred Embodiment>

Figure 7:
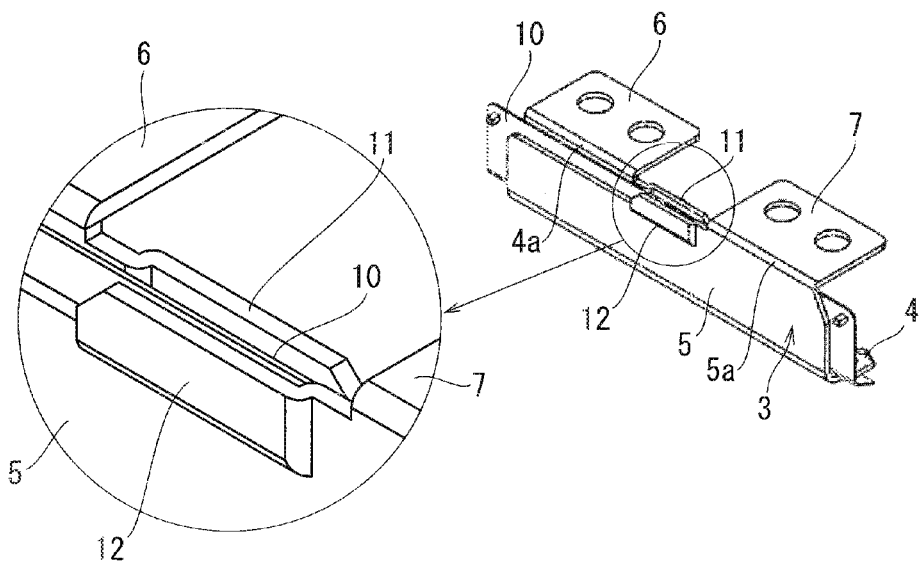
FIG. 7 is a perspective view of a parallel plate and electrodes of a semiconductor device according to a third preferred embodiment.
Figure 8:
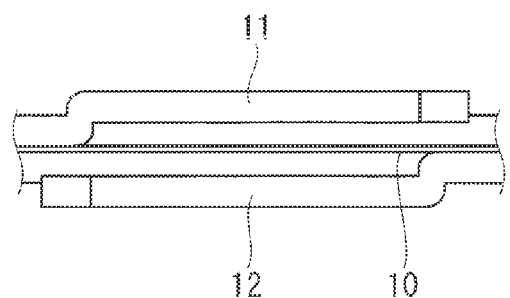
FIG. 8 is a plan view showing a portion of the parallel plate between electrode lead-out portions of the semiconductor device according to the third preferred embodiment.

Next, a semiconductor device according to a third preferred embodiment is described. FIG. 7 is a perspective view of the parallel plate 3, the electrode 6, and the electrode 7 of the semiconductor device according to the third preferred embodiment. FIG. 8 is a plan view showing a portion of the parallel plate 3 between the electrode lead-out portions 4*a*, 5*a* of the semiconductor device according to the third preferred embodiment. In the third preferred embodiment, the same components as those described in the first and second preferred embodiments are denoted by the same references, which are not described here.

As shown in FIGS. 7 and 8, in the third preferred embodiment, an upper portion of the flat plate 4 between the electrode lead-out portions 4a, 5a includes a projecting portion 11, and the upper portion of the flat plate 5 between the electrode lead-out portions 4a, 5a includes the projecting portion 12. Thus, a distance between the upper portions of the two flat plates 4, 5 of the parallel plate 3 between the electrode lead-out portions 4a, 5a is greater than a distance between portions except for the upper portions between the electrode lead-out portions 4a, 5a. Here, similarly to the second preferred embodiment, the projecting portions 11, 12 are formed by drawing.

As described above, in the semiconductor device according to the third preferred embodiment, the upper portions of both of the two flat plates 4, 5 of the parallel plate 3 between the two electrode lead-out portions 4a, 5a include the corresponding projecting portions 11, 12 that project to the outside being the direction in which the upper portions of the two flat plates 4, 5 become more distant from each other. Thus, the effects similar to those of increasing the thickness of the upper portions of the two flat plates 4, 5 of the parallel plate 3 between the electrode lead-out portions 4a, 5a can be obtained, so that a self-inductance of the semiconductor device can be reduced. Furthermore, the effect of equalizing flow pressure of resin upon insert molding of the resin case 1 and the parallel plate 3 can also be obtained.

<Fourth Preferred Embodiment>

Figure 9:
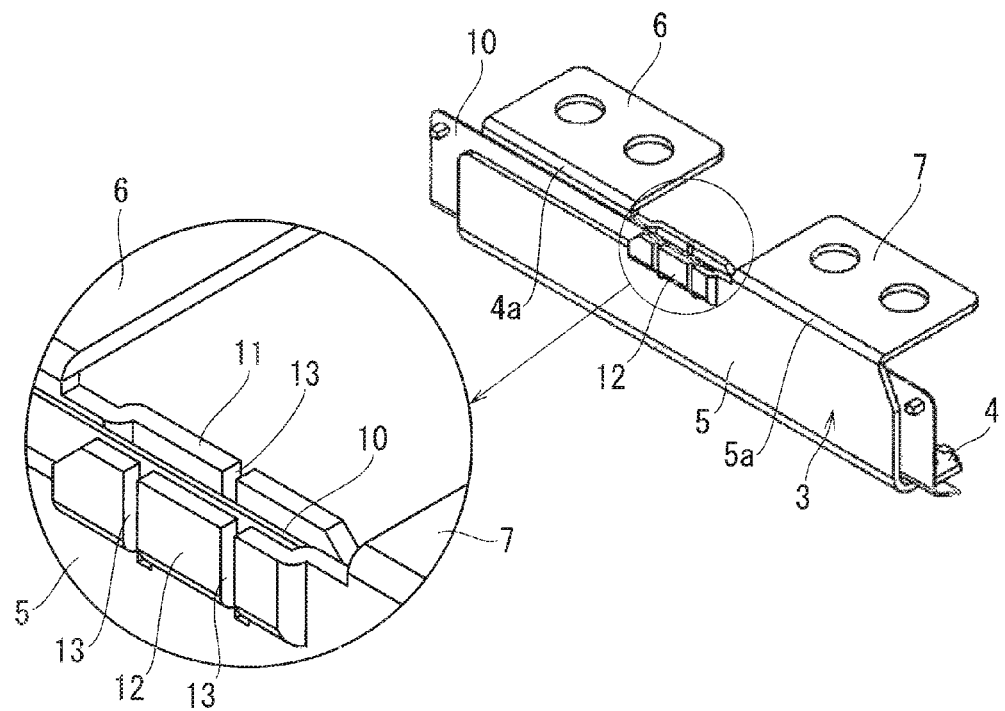
FIG. 9 is a perspective view of a parallel plate and electrodes of a semiconductor device according to a fourth preferred embodiment.

Next, a semiconductor device according to a fourth preferred embodiment is described. FIG. 9 is a perspective view of the parallel plate 3, the electrode 6, and the electrode 7 of the semiconductor device according to the fourth preferred embodiment. In the fourth preferred embodiment, the same components as those described in the first to third preferred embodiments are denoted by the same references, which are not described here.

As shown in FIG. 9, in the fourth preferred embodiment, the projecting portions 11, 12 each include a dividing portion 13 that divides each of the projecting portions 11, 12 into a plurality of portions. More specifically, the dividing portion 13 is formed in a slit shape extending horizontally and divides each of the projecting portions 11, 12 into the plurality of portions in a width direction. In addition, only one of the projecting portions 11, 12 may include the dividing portion 13.

As described above, in the semiconductor device according to the fourth preferred embodiment, the projecting portions 11, 12 each include the dividing portion 13 that divides each of the projecting portions 11, 12 into the plurality of portions, thereby improving flowability of resin upon insert molding of the resin case 1 and the parallel plate 3.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a resin case that houses a semiconductor element;
a parallel plate structure that is disposed inside said resin case while being connected with said semiconductor element, said parallel plate structure including two flat plates parallel to each other with an insulating material therebetween; and
two electrodes that are led out from an upper end of said parallel plate structure by two electrode lead-out portions, the two electrodes being disposed on an upper surface of said resin case at a predetermined interval,
wherein upper end portions of said two flat plates of said parallel plate structure include bent portions that are disposed between said two electrode lead-out portions, the bent portions being bent apart such that ends of the bent portions are further apart than other portions of the bent portions.

2. The semiconductor device according to claim 1, wherein a region corresponding to a portion between said two electrode lead-out portions on the upper surface of said resin case is formed in a planar shape.

3. The semiconductor device according to claim 1, wherein a region of the upper surface of said resin case corresponding to a portion between said two electrode lead-out portions is located in a height position between upper surfaces of said two electrodes and lower surfaces of said two electrodes.

4. A semiconductor device, comprising:
a resin case that houses a semiconductor element;
a parallel plate structure that is disposed inside said resin case while being connected with said semiconductor element, said parallel plate structure including two flat plates parallel to each other with an insulating material therebetween; and
two electrodes that are led out from an upper end of said parallel plate structure by two electrode lead-out portions, the two electrodes being disposed on an upper surface of said resin case at a predetermined interval,
wherein an upper portion of at least one of said two flat plates of said parallel plate structure includes a projecting portion disposed between said two electrode lead-out portions, the projecting portion projecting away from said insulating material such that a distance between said two flat plates in a region between said two electrode lead-out portions that includes said projecting portion is greater than a distance between said two flat plates in another region that does not include said projecting portion.

5. The semiconductor device according to claim 4, wherein
said projecting portion includes a dividing portion that divides said projecting portion into a plurality of portions.

6. The semiconductor device according to claim 4, wherein
said projecting portion is formed by drawing.

7. The semiconductor device according to claim 4, wherein the upper portions of both of said two flat plates of said parallel plate structure between said two electrode lead-out portions include projecting portions.

8. The semiconductor device according to claim 4, wherein a region corresponding to a portion between said two electrode lead-out portions on the upper surface of said resin case is formed in a planar shape.

9. The semiconductor device according to claim 4, wherein a region of the upper surface of said resin case corresponding to a portion between said two electrode lead-out portions is located in a height position between upper surfaces of said two electrodes and lower surfaces of said two electrodes.

* * * * *